United States Patent
Urano et al.

(10) Patent No.: US 8,709,912 B2
(45) Date of Patent: Apr. 29, 2014

(54) SEMICONDUCTOR DEVICE MANUFACTURING METHOD AND DEVICE FOR SAME

(75) Inventors: Yuichi Urano, Matsumoto (JP); Kenichi Kazama, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 12/937,434

(22) PCT Filed: Apr. 15, 2009

(86) PCT No.: PCT/JP2009/057566
§ 371 (c)(1),
(2), (4) Date: Jan. 24, 2011

(87) PCT Pub. No.: WO2009/142078
PCT Pub. Date: Nov. 26, 2009

(65) Prior Publication Data
US 2011/0129989 A1 Jun. 2, 2011

(30) Foreign Application Priority Data
May 22, 2008 (JP) .................................. 2008-133977

(51) Int. Cl.
*H01L 21/30* (2006.01)
(52) U.S. Cl.
USPC .... 438/455; 438/458; 438/459; 257/E21.237; 257/E21.567; 257/E21.6
(58) Field of Classification Search
USPC .............................. 438/455, 458, 459; 118/56; 257/E21.237, E21.567, E21.6
See application file for complete search history.

(56) References Cited

U.S. PATENT DOCUMENTS 7,229,744 B2 * 6/2007 Patel ............................. 430/302
7,452,752 B2   11/2008 Noda et al.
(Continued)

FOREIGN PATENT DOCUMENTS

| JP | 2004-064040 A | 2/2004 |
| JP | 2005-005672 A | 1/2005 |
| JP | 2005-159155 A | 6/2005 |

(Continued)

OTHER PUBLICATIONS

International Search Report issued in related PCT/JP2009/057566 mailed May 26, 2009.

*Primary Examiner* — Julia Slutsker
(74) *Attorney, Agent, or Firm* — Rossi, Kimms & McDowell LLP

(57) ABSTRACT

Even when a substrate for treatment is joined with a supporting substrate having an outer shape larger than that of the substrate for treatment, with a photothermal conversion layer and an adhesive layer interposed, and the surface of the substrate for treatment on the side opposite this joined surface is treated, the occurrence of a defective external appearance on the treatment surface of the substrate for treatment is prevented.
An adhesive layer 4 is formed on one surface of a substrate for treatment 3, a photothermal conversion layer 2 is formed on one surface of a supporting substrate 1 having a surface with an outer shape larger than that of the surface of the substrate for treatment, and the substrate for treatment 3 is bonded onto the surface of the photothermal conversion layer 2 with the adhesive layer 4 interposed, to obtain a layered member. This layered member is placed on a spin chuck 9 in a chamber 8 of a spin coater device, an alkaline aqueous solution 11 is dropped onto a portion 2a of the photothermal conversion layer 2 which protrudes from the substrate for treatment, and thereafter cleaning is performed on this portion using a high-pressure cleaning nozzle 12. Then, grinding, wet treatment, or similar treatment is performed on the surface of the substrate for treatment 3, to manufacture a semiconductor device.

13 Claims, 10 Drawing Sheets

(56) References Cited

U.S. PATENT DOCUMENTS

| | | |
|---|---|---|
| 2005/0233547 A1 | 10/2005 | Noda et al. |
| 2006/0042491 A1* | 3/2006 | Adachi et al. ............. 101/463.1 |
| 2007/0077685 A1 | 4/2007 | Noda et al. |
| 2008/0318162 A1* | 12/2008 | Miller et al. ................. 430/302 |

FOREIGN PATENT DOCUMENTS

| | | |
|---|---|---|
| JP | 2007-177210 A | 7/2007 |
| JP | 2008-010464 A | 1/2008 |
| JP | 2008-072134 A | 3/2008 |
| WO | 2008/002790 A1 | 1/2008 |

\* cited by examiner

SEMICONDUCTOR DEVICE MANUFACTURING METHOD AND DEVICE FOR SAME

This application is a U.S. National Phase Application of PCT International Application PCT/JP2009/057566 filed on Apr. 15, 2009 which is based on and claims priority from JP 2008-133977 filed on May 22, 2008 the contents of which are incorporated herein by reference in their entirety.

TECHNICAL FIELD

This invention relates to a method for manufacturing a semiconductor device by affixing a silicon wafer or other substrate for treatment onto a supporting substrate and performing treatment of the substrate for treatment, as well as to a device to remove a portion of a layer for the purpose of this manufacturing.

BACKGROUND ART

In recent years, treatment has been performed in which a semiconductor wafer or other substrate for treatment is affixed to a hard supporting substrate, after which the surface of the substrate for treatment opposite the affixed surface is treated. For example, Patent Reference 1 discloses a technique in which a substrate for treatment is affixed to glass, which is a supporting substrate, with a photothermal conversion layer and an adhesive interposed, grinding treatment is performed on the substrate for treatment to an extremely thin shape, and after grinding, the substrate for treatment is separated from the supporting substrate without being damaged.

This technique is explained referring to FIG. 16 through FIG. 22. As shown in FIG. 16, a mixed solution comprising carbon black or another optical absorbent and a thermally decomposable resin is applied using a spin coater onto a supporting substrate 1 comprising circular glass, and is dried to form a photothermal conversion layer 2. Further, a UV-hardening adhesive is applied using a spin coater onto the rear surface of a substrate for treatment 3 comprising a silicon wafer, to form an adhesive layer 4. Next, as shown in FIG. 17, the photothermal layer 2 of the supporting substrate 1 and the adhesive layer 4 of the substrate for treatment 3 are opposed and joined together, after which ultraviolet light 5 is used for irradiation from the side of the supporting substrate 1, hardening the adhesive layer 4 and bonding the supporting substrate 1 and the substrate for treatment 3.

And, as shown in FIG. 18, the substrate for treatment 3 immobilized on the supporting substrate 1 is ground to reduce the thickness. After grinding has ended, YAG laser light 6 is used for irradiation from the side of the supporting substrate 1, as shown in FIG. 19. By this means, the photothermal conversion layer 2b is decomposed, and the substrate for treatment 3a which has been reduced in thickness can be separated from the supporting substrate 1 without destroying the substrate (FIG. 20). Finally, as shown in FIG. 21, adhesive tape 7 for separation is affixed to the adhesive layer 4 remaining on the rear surface of the substrate for treatment 3a, and by peeling the adhesive tape 7, the adhesive layer 4 can be removed from the substrate for treatment 3a (FIG. 22).

In this technique, the supporting substrate 1 must have an outer shape larger than that of the substrate for treatment 3. This is because, if the outer shape of the supporting substrate 1 is equal to or smaller than the substrate for treatment 3, the adhesive protrudes, the adhesive layer 4 makes contact and adheres to the supporting substrate 1 without interposing of the photothermal conversion layer 2, and there are cases in which the supporting substrate 1 can no longer be separated from the substrate for treatment 3.

Patent Reference 1: Japanese Patent Application Laid-open No. 2004-64040

However, in this technique, when a supporting substrate 1 having a larger outer shape is joined together with a substrate for treatment 3 and the substrate for treatment 3 is ground, the photothermal conversion layer 2 protruding from the substrate for treatment 3 is also ground and removed, as shown in FIG. 18, and as a result, carbon black or other insoluble foreign matter 2d contained in the photothermal conversion layer 2 may re-adhere to the treatment surface of the substrate for treatment 1 and become a cause of defective external appearance (FIG. 19 through FIG. 22). Further, such defective external appearance is not limited to the above-described grinding treatment, and also occurs by, when performing treatment on the surface on the opposite side of the joined surface of the substrate for treatment, simultaneously treating the photothermal conversion layer protruding from the substrate for treatment, and thereby causing re-adhesion of foreign matter contained in the photothermal conversion layer to the substrate for treatment.

DISCLOSURE OF THE INVENTION

Hence in light of the above problems, an object of this invention is to provide a semiconductor device manufacturing method by which, even when a substrate for treatment is joined together with a supporting substrate with an outer shape larger than the substrate for treatment with a photothermal conversion layer and adhesive layer interposed, and the surface of the substrate for treatment on the side opposite the joining surface is treated, the occurrence of defective external appearance on the treatment surface of the substrate for treatment can be prevented, and to provide a device for such a method.

In order to attain the above object, one mode of a method for manufacturing a semiconductor device of this invention is characterized in having a process of forming an adhesive layer on one surface of a substrate for treatment; a process of forming a photothermal conversion layer on one surface of a supporting substrate having a surface with an outer shape larger than that of the surface of the substrate for treatment; a process of bonding the substrate for treatment onto the surface of the photothermal conversion layer with the adhesive layer interposed, to obtain a layered member; a process of removing, from the layered member, a portion of the photothermal conversion layer that protrudes from the substrate for treatment, and cleaning the portion; a process of performing, for the layered member after the removal and cleaning, treatment on the surface (hereafter also called the "treatment surface") of the substrate for treatment on the side opposite the surface bonded with the supporting substrate; and a process of separating the substrate for treatment after the treatment, from the adhesive layer.

Further, another mode of a method for manufacturing a semiconductor device of this invention is characterized in having a process of forming an adhesive layer on one surface of a substrate for treatment; a process of forming a photothermal conversion layer on one surface of a supporting substrate having a surface with an outer shape larger than that of the surface of the substrate for treatment; a process of bonding the substrate for treatment onto the surface of the photothermal conversion layer with the adhesive layer interposed, to obtain a layered member; a process of performing, for the layered member, treatment on the surface of the substrate for treatment on the side opposite the surface bonded with the supporting substrate; a process of removing, from the layered member, a portion of the photothermal conversion layer that protrudes from the substrate for treatment, and cleaning the portion, during the process of performing treatment on the surface on the side opposite the bonded surface; and a process of separating the substrate for treatment in which treatment of the surface on the side opposite the bonded surface is completed, from the adhesive layer.

In the process of partially removing the photothermal conversion layer and performing cleaning, it is preferable that an alkaline aqueous solution be dropped onto the portion protruding from the substrate for treatment, and thereafter cleaning be performed using a cleaning liquid flow. It is preferable that the cleaning liquid flow be under high pressure, and it is preferable that water be used as the cleaning liquid flow. Further, in the process of partially removing the photothermal conversion layer and performing cleaning, it is preferable that an alkaline aqueous solution be dropped onto the portion protruding from the substrate for treatment, and thereafter cleaning be performed using a brush. It is preferable that the alkaline aqueous solution be sodium hydroxide aqueous solution, potassium hydroxide aqueous solution, aqueous ammonia, tetra-methyl ammonium hydroxide (TMAH) aqueous solution, or aqueous ammonia-hydrogen peroxide solution, or a liquid mixture of these. In the process of separating the substrate for treatment from the adhesive layer, it is preferable that the photothermal conversion layer be decomposed by irradiating with radiant energy and that the substrate for treatment be separated from the supporting substrate.

Further, another aspect of the invention is a device which is used for a substrate for treatment having one surface on which an adhesive layer is formed and a supporting substrate having one surface on which a photothermal conversion layer is formed, the substrate for treatment and the supporting substrate being bonded together with the adhesive layer and the photothermal conversion layer interposed, the device using an alkaline aqueous solution to remove a portion of the photothermal conversion layer that protrudes from the substrate for treatment due to the surface of the supporting substrate having a surface with an outer shape larger than that of the surface of the substrate for treatment, and to clean the portion, and the device being characterized in having means for dropping the alkaline aqueous solution onto the portion of the photothermal conversion layer protruding from the substrate for treatment; and means for cleaning the photothermal conversion layer dissolved by the alkaline aqueous solution, from the supporting substrate.

It is preferable that the means for cleaning the dissolved photothermal conversion layer be means for spraying a high-pressure water flow. Further, it is preferable that the means for cleaning the dissolved photothermal conversion layer be a brush.

In this way, the portion of the photothermal conversion layer on the supporting substrate that protrudes from the substrate for treatment is removed, and cleaning is performed, and thereafter treatment of the surface of the substrate for treatment on the side opposite the bonded surface (the treatment surface) is performed, so that dissolution of the photothermal conversion layer during treatment of the treatment surface can be prevented. Hence a defective external appearance arising from re-adhesion to the substrate for treatment of foreign matter contained in this photothermal conversion layer can be prevented.

BEST MODE FOR CARRYING OUT THE INVENTION

Below, an embodiment of a method for manufacturing a semiconductor device of this invention, and a device used in this method, are explained, referring to the attached drawings.

Figure 1:
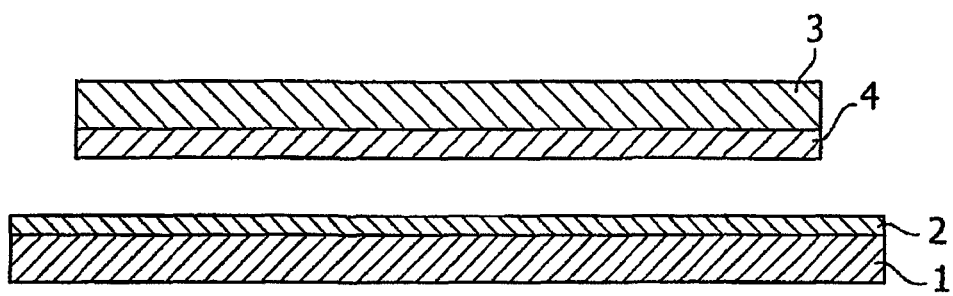
FIG. 1 is a cross-sectional view schematically showing a layered structure, to explain one embodiment of a method for manufacturing a semiconductor device of the invention.

As shown in FIG. 1, first a photothermal conversion layer 2 is formed on one surface of a supporting substrate 1. No limitations in particular are imposed so long as the supporting substrate 1 has the property of transmitting light, and glass, an acrylic resin, or similar are preferable. No limitations in particular are imposed so long as the supporting substrate 1 has a surface with an outer shape larger than that of the surface of the substrate for treatment 3, described below, and a circular, elliptical, square, rectangular, regular polygonal, or similar shape is preferable. As such a supporting substrate 1, for example circular Pyrex (a registered trademark) glass of diameter 152 mm and thickness 0.7 mm can be used.

As the photothermal conversion layer 2, no limitations in particular are imposed, so long as the photothermal conversion layer 2 has the property that, upon absorbing laser light or other light and converting into thermal energy to cause an increase in the layer temperature, so that the temperature reaches a prescribed temperature, thermal decomposition occurs. It is preferable that this photothermal conversion layer 2 be a mixture of a light absorbing agent and a thermally decomposing resin. As the light absorbing agent, for example, carbon black, graphite powder, or fine metal powders of iron, aluminum, copper, nickel, cobalt, manganese, chromium, zinc, tellurium, or similar, as well as black titanium oxide and other metal oxide powders, or aromatic diamine-system metal complexes, aliphatic diamino-system metal complexes, aromatic dithiol-system metal complexes, mercaptophenol-system metal complexes, squarylium-system compounds, cyanine-system dyes, methine-system dyes, naphthoquinone-system dyes, anthraquinone-system dyes, and other dyestuffs or pigments, can be used. Further, as the thermally decomposing resin, for example block copolymers or similar containing gelatins, cellulose, cellulose esters (for example cellulose acetate, nitrocellulose), polyphenols, polyvinylbutyrals, polyvinylacetals, polycarbonates, polyurethanes, polyesters, poly(ortho esters), polyacetals, polyvinyl alcohols, polyvinyl pyrolidones, copolymers of vinylidene chloride and acrylonitrile, poly(metha)acrylates, polyvinyl chlorides, silicone resins, and/or polyurethane units can be used, either singly or as mixtures of two or more types.

The photothermal conversion layer 2 can for example be formed by applying a mixture solution comprising an above-described light absorbing agent and thermally decomposing resin and a solvent onto a surface of the supporting substrate 1, and drying. As the solvent, it is preferable that propylene glycol methyl ether acetate or similar be used. As the method of application, spin coating, die coating, roll coating, or similar can be adopted. It is preferable that the photothermal conversion layer 2 have a thickness of 0.5 to 2.0 μm. By making the thickness in this range, separation of the supporting substrate 1 and the adhesive layer 4 by thermal composition can be performed satisfactorily, and light irradiated from the side of the supporting substrate 1 can be transmitted adequately.

It is preferable that the photothermal conversion layer 2 have a thermal decomposition temperature in the range 100 to 200° C. This temperature range is higher than the temperature of chemical liquids used in plating treatment (normally 80° C.) when for example performing electroless nickel plating treatment as the treatment of the surface of the substrate for treatment 3 on the side opposite the surface bonded with the supporting substrate 1. Hence in the process of plating treatment, thermal decomposition of the photothermal conversion layer 2 does not occur, so that contamination of the plating liquid can be prevented. Hence when forming the photothermal conversion layer 2, drying is performed at a temperature sufficiently lower than the thermal decomposition temperature. For example, it is preferable that drying be performed using an oven or other drying device at 150 to 200° C.

Further, as shown in FIG. 1, the adhesive layer 4 is formed on one surface of the substrate for treatment 3. The substrate for treatment 3 becomes the substrate obtained by the method of this invention. As the substrate for treatment 3, for example silicon, gallium arsenide (GaAs), and other semiconductor wafers, liquid crystal wafers, sapphire, and glass can be used. The shape, size, and similar of the substrate for treatment 3 depend on the application for the substrate obtained, but a circular, elliptical, square, rectangular, regular polygonal, or similar shape is preferable. In the case of a circular shape, for a 5-inch wafer a diameter of 100 mm or less, and for a 6-inch wafer a diameter of 150 mm or less is desirable. Further, it is preferable that the thickness be in the range 500 to 700 μm, regardless of the shape. This is because at thicknesses of 500 μm or less the strength of the wafer by itself is reduced, and at 700 μm or greater the wafer cannot fit into a cassette for storage, or cannot be inserted by a robot hand between a plurality of wafers stored in a cassette. For example, circular silicon wafers of diameter 150 mm and thickness 625 μm can be used. Here, when the substrate is made extremely thin, a wafer of thickness 500 to 700 μm may be used as the substrate for treatment 3, and as treatment of the surface on the side opposite the surface bonded with the supporting substrate 1, for example a process to reduce the wafer thickness may be used. As the process to reduce the thickness, grinding of the wafer surface may be performed, or etching may be performed. Or, grinding and etching may be combined. There is no need for the supporting substrate 1 and the substrate for treatment 3 to have similar shapes, and the shapes of each may be arbitrary.

No limitations in particular are imposed on the adhesive of the adhesive layer 4, so long as the adhesive has properties enabling immobilization of the substrate for treatment 3 and the photothermal conversion layer 2 as well as separation from the substrate for treatment 3. As such an adhesive, a rubber-system adhesive in which rubber, an elastomer, or similar is dissolved in a solvent, a single-liquid thermosetting adhesive based on an epoxy, urethane or similar, a two-liquid mixed reaction-type adhesive based on an epoxy, urethane, acrylic or similar, a hot-melt type adhesive, an ultraviolet-ray (UV) or electron beam-hardening type adhesive based on an acrylic, epoxy or similar, or a water-dispersed type adhesive, may be used. Among these, a UV-hardening adhesive is particularly preferable.

The adhesive layer 4 can be formed by applying an adhesive onto the substrate for treatment 3. As the application method, spin coating or similar can be adopted. A thickness for the adhesive layer 4 in the range 25 to 100 μm is preferable. This is because, if the adhesive layer thickness is 25 μm or less, when joining together the supporting substrate 1 and the substrate for treatment 3, air gaps in the adhesive occur at the joined surfaces; and if the thickness is 100 μm or greater, adhesive protrudes at side surface portions of the substrate for treatment 3, and moreover adhesive spreads onto the surface side of the substrate for treatment 3, that is, onto the treatment surface, impeding the process of treating the treatment surface, and it is difficult to strip off the adhesive.

Figure 2:
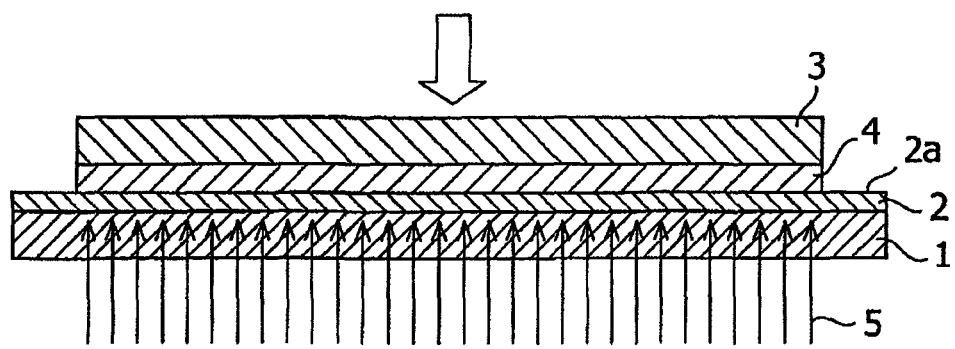
FIG. 2 is a cross-sectional view schematically showing a layered structure, to explain one embodiment of a method for manufacturing a semiconductor device of the invention.

Next, as shown in FIG. 2, the photothermal conversion layer 2 formed on the supporting substrate 1 and the adhesive layer 4 formed on the substrate for treatment 3 are brought into opposition, and the two are joined together. At this time, because the outer shape of the supporting substrate 1 is larger than that of the substrate for treatment 3, joining together is performed such that the outer periphery of the supporting substrate protrudes from the substrate for treatment 3. Further, it is preferable that the supporting substrate 1 and the substrate for treatment 3 be joined together while removing air bubbles in the adhesive layer 4 within a depressurized chamber (not shown). Further, when a UV-hardening adhesive is used to form the adhesive layer 4, ultraviolet light 5 is used in irradiation from the surface on the side of the supporting substrate 1, as shown in FIG. 2, the UV-hardening adhesive is hardened, and the substrate for treatment 3 is immobilized on the supporting substrate 1. It is preferable that the UV intensity of the ultraviolet light 5 be in the range 100 to 200 mJ/cm$^2$. As explained above, the outer shape of the supporting substrate 1 is larger than that of the substrate for treatment 3, so that whereas the entire surface of the adhesive layer 4 on the substrate for treatment 3 is covered by the photothermal conversion layer 2, a portion 2a of the photothermal conversion layer 2 on the supporting substrate 1 remains protruding. When the supporting substrate 1 and the substrate for treatment 3 are both circular, it is preferable that joining be performed concentrically.

Figure 3:
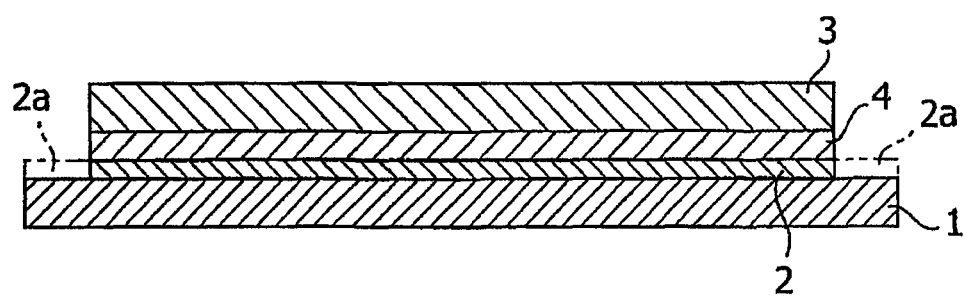
FIG. 3 is a cross-sectional view schematically showing a layered structure, to explain one embodiment of a method for manufacturing a semiconductor device of the invention.

And, as shown in FIG. 3, the portion 2a of this photothermal conversion layer 2 protruding from the substrate for treatment 3 is removed using an alkaline aqueous solution. No limitations in particular are imposed on the alkaline aqueous solution so long as removal of the photothermal conversion layer 2 is possible, and sodium hydroxide aqueous solution, potassium hydroxide aqueous solution, aqueous ammonia, tetra-methyl ammonium hydroxide (TMAH) aqueous solution, or aqueous ammonia-hydrogen peroxide solution, or a liquid mixture of these, can be used. It is preferable that the alkaline aqueous solution have a pH of 9.7 or higher. The following results were obtained in tests in which aqueous solutions with three different pH's were used to remove a black layer (a layer formed to a thickness of approximately 1 μm, the main components of which were carbon black and an acrylic system resin).

TABLE 1

|  | pH | Black layer removal |
| --- | --- | --- |
| NaOH aqueous | 9.7 | removed |
| NH3OH aqueous | 5.0 | black layer remained |
| TMAH aqueous | 12.2 | removed |

In particular, when a treated substrate obtained by this invention is used in a semiconductor device, it is preferable that a TMAH aqueous solution and aqueous ammonia-hydrogen peroxide solution be used. TMAH aqueous solution is generally used as a resist developing liquid, and can eliminate the effects of sodium and other mobile ions and of heavy metal contamination. A TMAH concentration in the aqueous solution of 1 to 3 wt % is preferable.

Aqueous ammonia-hydrogen peroxide solution is generally used in wet cleaning in semiconductor processes, and can eliminate the effects of sodium and other mobile ions and of heavy metal contamination. It is preferable that in the aqueous ammonia-hydrogen peroxide solution the mixture weight ratio of $NH_4OH$ to $H_2O_2$ be in the range from 1:1 to 1:107, and still more preferably in the range from 1:1 to 1:11, and the ratio 1:1 is most preferable. For example, when mixing $NH_4OH$ solution (concentration 28 wt %), $H_2O_2$ solution (concentration 30 wt %), and water, a weight ratio in the range from 1:1:1 to 1:100:1 is preferable, a weight ratio in the range from 1:1:1 to 1:10:1 is still more preferable, and the most preferable ratio is 1:1:1. An aqueous ammonia-hydrogen peroxide solution can dissolve a photothermal conversion layer 2 in a short time even at normal temperatures, but by heating to for example 75 to 85° C., the dissolution rate can be increased and throughput can be improved.

Figure 9:
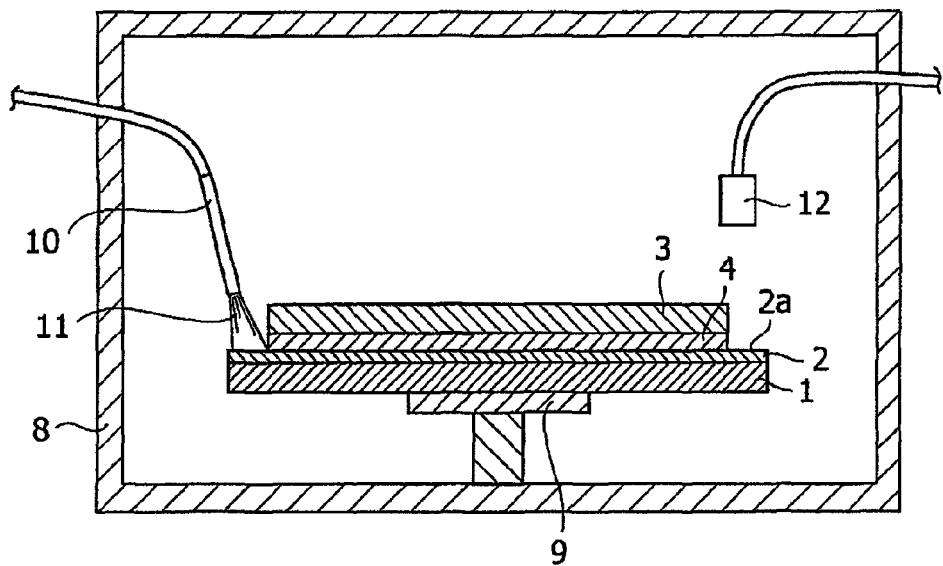
FIG. 9 is a cross-sectional view schematically showing one embodiment of a removal device of the invention.
Figure 10:
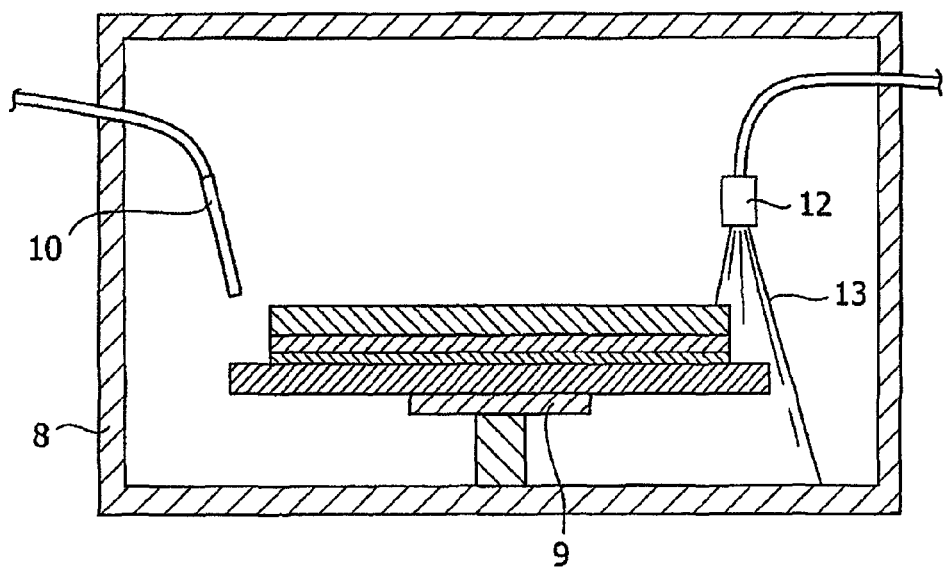
FIG. 10 is a cross-sectional view schematically showing one embodiment of a removal device of the invention.

The alkaline aqueous solution can be applied onto the protruding portion 2a of the photothermal conversion layer 2 by spin coating or a similar method. FIG. 9 and FIG. 10 show an embodiment of a spin coater device to remove the protruding portion 2a by spin coating. As shown in FIG. 9 and FIG. 10, within the chamber 8 are installed a spin chuck 9 which holds the layered member in a state in which a portion of the photothermal conversion layer 2 protrudes from the above-described substrate for treatment 3; a chemical liquid application nozzle 10 which applies the alkaline aqueous solution 11 onto an edge portion of the layered member; and a high-pressure cleaning nozzle 12 which sprays a high-pressure cleaning liquid 13 onto an edge portion of the layered member. As the cleaning liquid, it is preferable that water be used.

The spin chuck 9 is configured so as to hold and rotate the layered member in the horizontal direction. A rotation rate of 50 to 100 rpm during chemical liquid application and high-pressure cleaning, and of 2000 to 4000 rpm during spin drying, is preferable. While depending on the sizes of the layered member and protruding portion and on the type and concentration of the alkaline aqueous solution, it is for example preferable that the chemical liquid application nozzle 10 drop the alkaline aqueous solution 11 at a flow rate of 30 to 60 cc/min. Further, it is preferable that the high-pressure cleaning nozzle 12 spray the high-pressure cleaning liquid 13 at a pressure in the range 5 to 10 MPa and at a flow rate in the range 0.5 to 1.0 SLM. SLM is a unit which is converted into the volume flow rate (L/min) at 0° C. and 0.1013 MPa.

In a spin coater device of this configuration, first the alkaline aqueous solution 11 (for example, TMAH aqueous solution of concentration 2.38 wt %; hereafter called "TMAH aqueous solution") is dropped from the chemical liquid application nozzle 10 while rotating the layered member at for example 60 rpm using the spin chuck 9. By this means the TMAH aqueous solution 11 is applied to the peripheral edge of the layered member, and the protruding photothermal conversion layer is dissolved. Next, while continuing to rotate the layered member, the high-pressure cleaning liquid 13 is sprayed from the high-pressure cleaning nozzle 12 at for example 10 MPa and 1 SLM. By this means, the dissolved photothermal conversion layer is cleaned and removed from the supporting substrate by the TMAH aqueous solution 11. While depending on the type and concentration of the alkaline aqueous solution 11, a time interval from dropping the alkaline aqueous solution 11 until spraying of the high-pressure cleaning liquid 13 of from 10 to 60 seconds is preferable, and from 15 to 30 seconds is still more preferable. In the case of the size of the layered member and the alkaline aqueous solution of the example, if this time interval is made approximately 30 seconds, the protruding photothermal conversion layer can be adequately removed.

Figure 11:
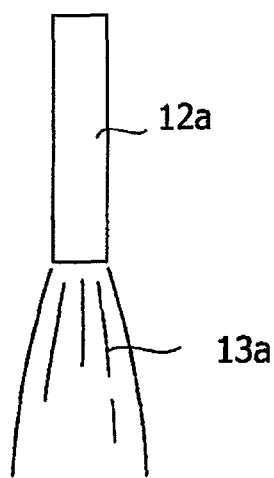
FIG. 11 is a schematic diagram showing one example of a cleaning liquid water flow in a removal device of the invention.
Figure 12:
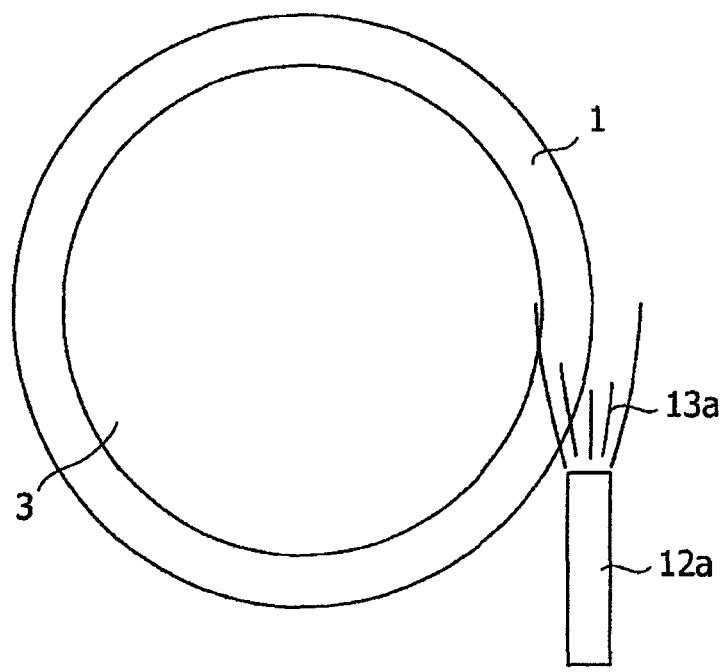
FIG. 12 is a plane view schematically showing one example of the cleaning liquid spraying direction in a removal device of the invention.

In FIG. 10, the cleaning liquid 13 is shown spreading radially while being sprayed from the high-pressure cleaning nozzle 12, but other configurations are possible, and as shown in FIG. 11, the cleaning liquid 13a may be sprayed in a flat shape from the high-pressure cleaning nozzle 12a without spreading in particular. Further, in FIG. 10 the cleaning liquid 13 is shown being sprayed from the high-pressure cleaning nozzle 12 in the direction perpendicular to the supporting substrate 1, but other configurations are possible, and the cleaning liquid may be sprayed from the center portion of the supporting substrate 1 toward the outer peripheral portion, or as shown in FIG. 12, the cleaning liquid 13a may be sprayed from the high-pressure cleaning nozzle 12a along the tangential direction of the circular supporting substrate 1.

Further, in the embodiment shown in FIG. 9 and FIG. 10, the chemical liquid application nozzle 10 and high-pressure cleaning nozzle 12 are arranged in a single spin coater device, and dissolution by the alkaline aqueous solution 11 and cleaning by the high-pressure cleaning liquid 13 are performed consecutively; of course, the chemical liquid application nozzle and the high-pressure cleaning nozzle may be arranged in different spin coater devices, and after the end of dissolution by the alkaline aqueous solution, the layered member may be transferred to a separate spin coater device, and cleaning using the high-pressure cleaning liquid may be performed.

Figure 4:
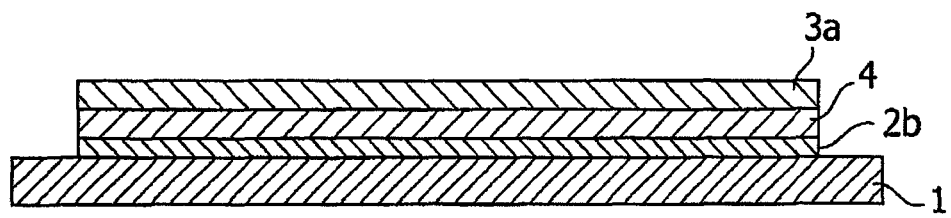
FIG. 4 is a cross-sectional view schematically showing a layered structure, to explain one embodiment of a method for manufacturing a semiconductor device of the invention.

Next, as shown in FIG. 4, treatment of the treatment surface on the side opposite the bonded surface of the substrate for treatment 3, immobilized on the supporting substrate 1, is performed. As the treatment of the treatment surface, for example treatment is performed to reduce the thickness of the substrate for treatment 3. As a process to reduce the thickness of the substrate for treatment 3, grinding or etching, or a combination of these, may be used. In the case of grinding, it is preferable that for example a grinding wheel be rotated to perform grinding. As etching liquid, KOH, TMAH, or similar are preferable. Treatment to reduce the thickness of the substrate for treatment 3a is performed until the substrate reaches the desired thickness. It is preferable that the thickness of the substrate for treatment 3a be 150 μm or less, still more preferably 50 μm or less, and still more preferably 25 μm or less. On the other hand, it is preferable that the thickness lower limit be 10 μm or greater. Further, treatment of the treatment surface is not limited to reducing the thickness, and wet treatments, sputtering, ion implantation, heat treatment, CVD, patterning (photolithography), and similar can be performed. Wet treatments include etching and plating treatments. As etching liquids, KOH, TMAH, and similar are preferable. As plating liquids, the use of electroless nickel plating liquids, displacement gold plating liquids and similar is preferable.

Figure 5:
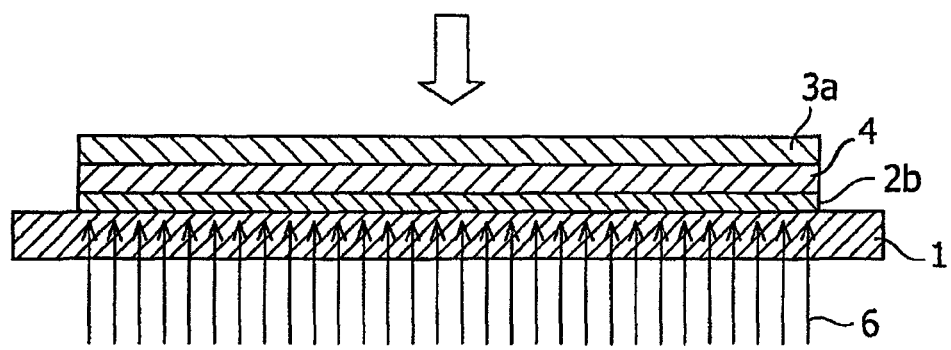
FIG. 5 is a cross-sectional view schematically showing a layered structure, to explain one embodiment of a method for manufacturing a semiconductor device of the invention.
Figure 6:
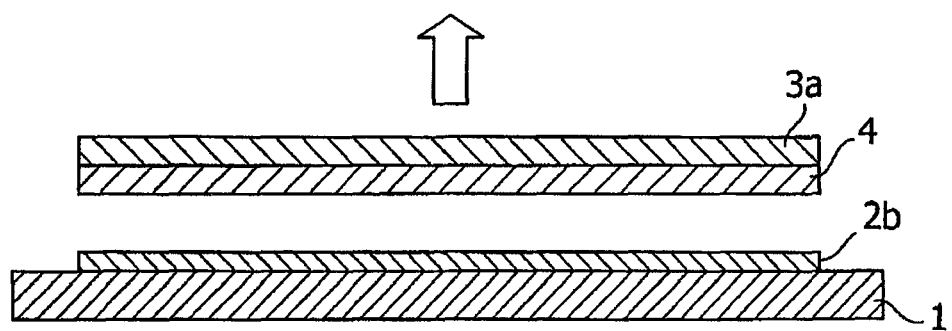
FIG. 6 is a cross-sectional view schematically showing a layered structure, to explain one embodiment of a method for manufacturing a semiconductor device of the invention.

After grinding, wet treatment, or other treatment of the treatment surface has ended, laser light or other light 6 is used in irradiation from the side of the supporting substrate 1, as shown in FIG. 5. As explained above, the photothermal conversion layer 2b undergoes thermal decomposition, so that as shown in FIG. 6, the substrate for treatment 3a can be separated from the supporting substrate 1 without being destroyed. No limitations in particular are imposed so long as the light is absorbed by the photothermal conversion layer 2b and converted into heat, to cause thermal decomposition of the photothermal conversion layer 2b; for example, irradiation with a YAG laser of wavelength 1064 nm is preferable. Laser light must scan the entire region of the substrate for treatment 3a.

Figure 7:
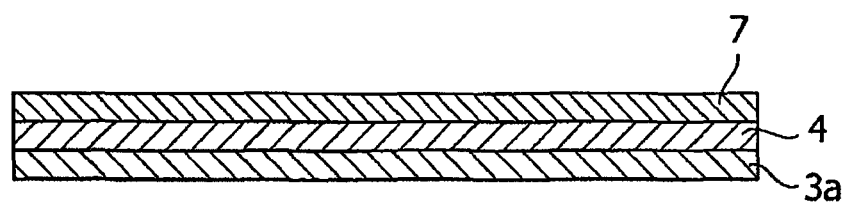
FIG. 7 is a cross-sectional view schematically showing a layered structure, to explain one embodiment of a method for manufacturing a semiconductor device of the invention.
Figure 8:
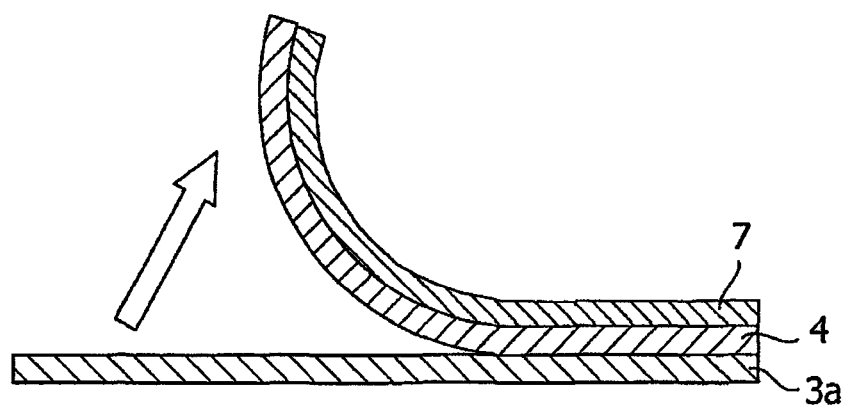
FIG. 8 is a cross-sectional view schematically showing a layered structure, to explain one embodiment of a method for manufacturing a semiconductor device of the invention.

The adhesive layer 4 remains on the substrate for treatment 3a after separation from the supporting substrate 1, and so by affixing adhesive tape 7 for separation to the surface of the adhesive layer 4 as shown in FIG. 7, and then stripping off the adhesive tape 7, the adhesive layer 4 can be separated from the substrate for treatment 3a, as shown in FIG. 8. No limitations in particular are imposed on the adhesive tape, and for example separation tape for backwrap tape or similar can be used.

From the above, adhesion of foreign matter caused by the photothermal conversion layer 2 can be prevented, and so a substrate for treatment 3a without a defective external appearance can be obtained. A substrate for treatment 3a obtained in this way can for example be used as a substrate for power semiconductors, and in particular for vertical-type power semiconductors. For use in a vertical-type power semiconductor, electrodes are formed on both surfaces of the substrate for treatment 3a, and current is passed from the rear surface to the front surface. To this end, in FIG. 1, after forming an electrode on one of the surfaces (the front surface) of the substrate for treatment 3, the supporting substrate 1 can be joined to the front surface of the substrate for treatment 3 in FIG. 4, with the adhesive layer 3 and photothermal conversion layer 4 interposed, and the other electrode can be formed on the surface (the rear surface) of the substrate for treatment 3 after grinding or wet treatment. For example, for an insulated-gate bipolar transistor (IGBT), the collector electrode is formed on the rear surface, and the emitter electrode is formed on the front surface. Hence in this case, by forming the emitter region and insulated gate structure in advance on the front surface of the substrate for treatment 3, and by forming the collector region and electrode on the surface subjected to grinding or wet treatment (the rear surface), an IGBT can be manufactured.

Figure 13:
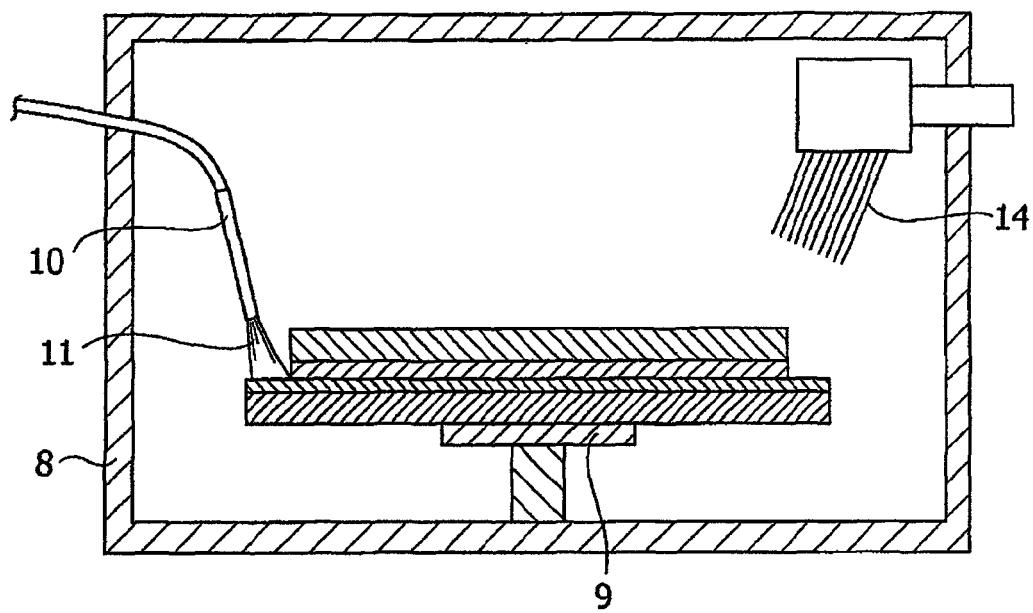
FIG. 13 is a cross-sectional view schematically showing another embodiment of a removal device of the invention.
Figure 14:
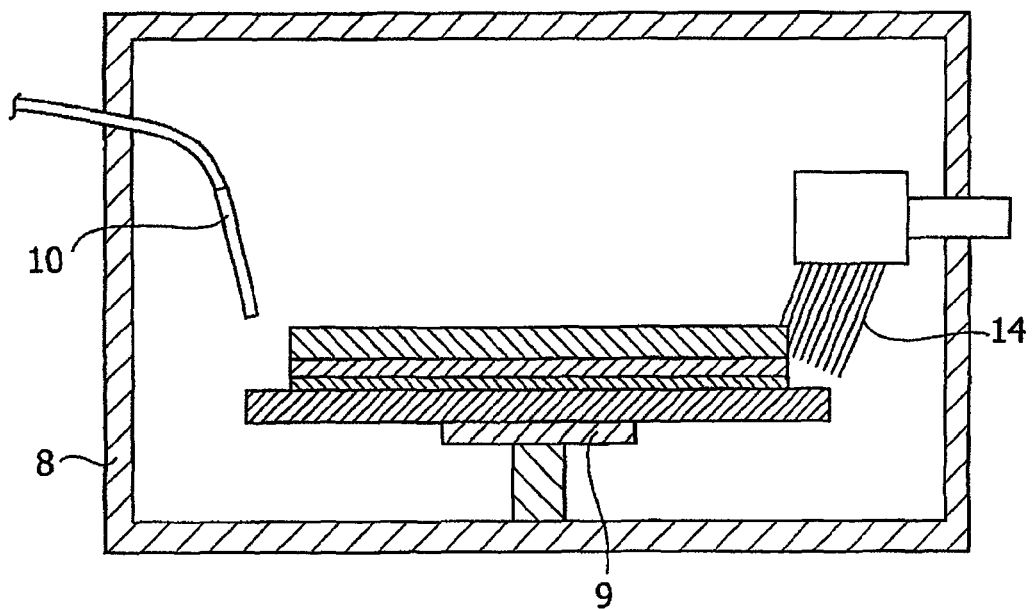
FIG. 14 is a cross-sectional view schematically showing another embodiment of a removal device of the invention.

A method for manufacturing a semiconductor device of this invention is not limited to the above-described embodiment, and other embodiments can be adopted. For example, in the process of removing the protruding photothermal conversion layer 2a shown in FIG. 3, a chemical liquid application nozzle 10 and a high-pressure cleaning nozzle 12 were installed in a spin coater device as shown in FIG. 9 and FIG. 10; but as shown in FIG. 13 and FIG. 14, a chemical liquid application nozzle 10 and a cleaning brush 14 can be arranged in a single spin coater device. The cleaning brush 14 is movable, and as shown in FIG. 13, waits above the layered member while alkaline aqueous solution 11 is being dispensed from the chemical liquid application nozzle 10, but after a prescribed time interval has elapsed from the end of application of the alkaline aqueous solution 11, the cleaning brush 14 is lowered and brought into contact with the peripheral edge of the layered member, and the photothermal conversion layer 2a dissolved by the alkaline aqueous solution can be cleaned and removed from the supporting substrate 1.

Figure 15:
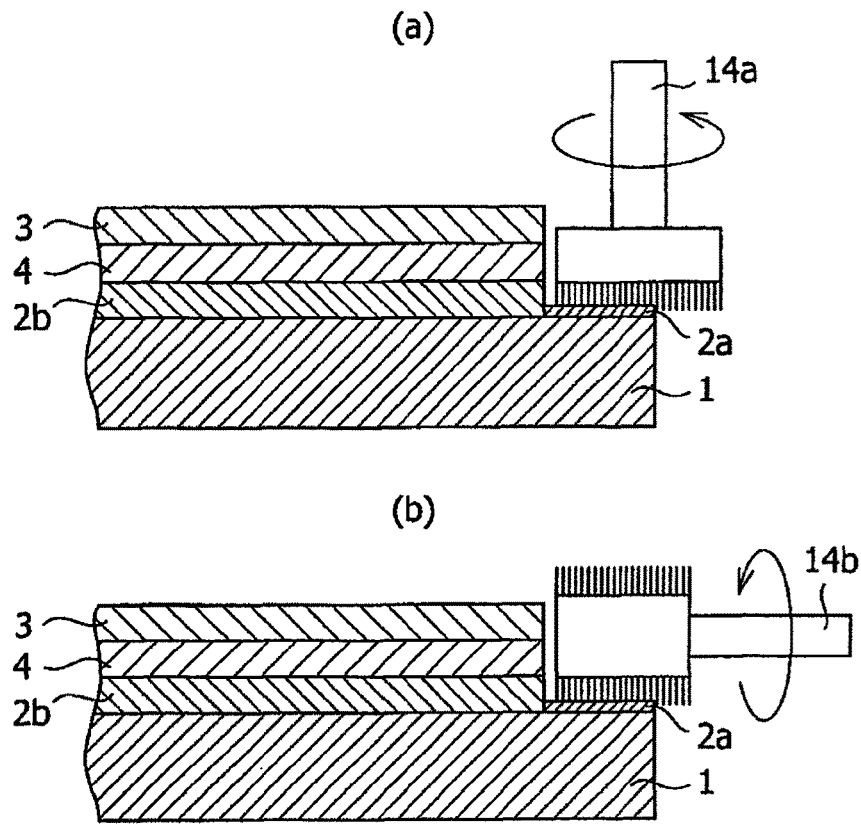
FIG. 15 is cross-sectional views schematically showing examples of brushes in a removal device of the invention.
Figure 16:
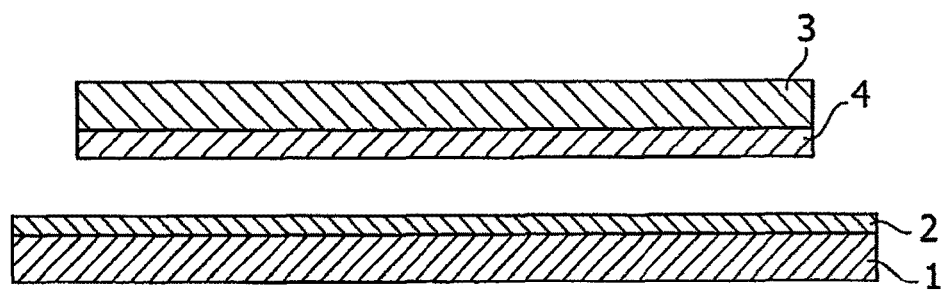
FIG. 16 is a cross-sectional view schematically showing a layered structure, to explain a method for manufacturing the prior art.
Figure 17:
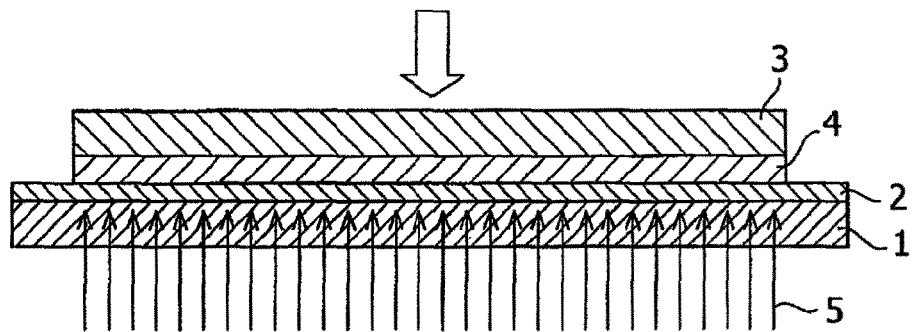
FIG. 17 is a cross-sectional view schematically showing a layered structure, to explain a method for manufacturing the prior art.
Figure 18:
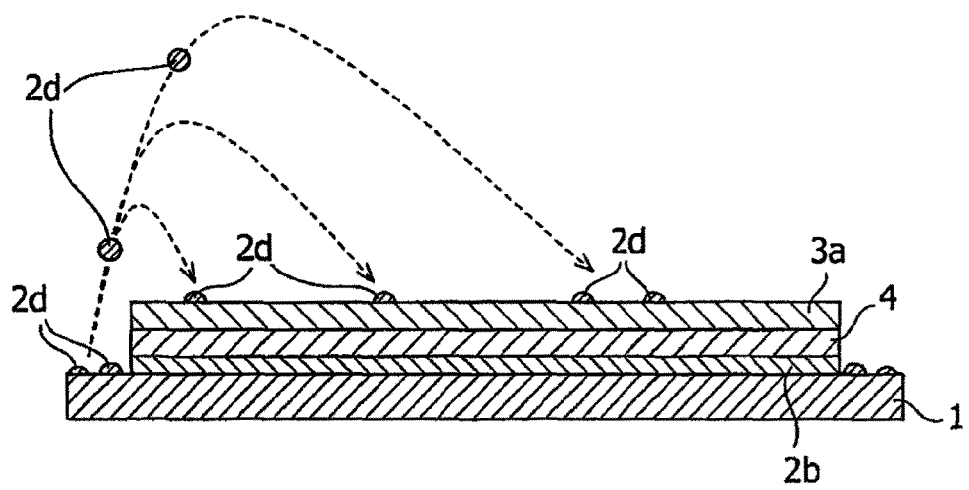
FIG. 18 is a cross-sectional view schematically showing a layered structure, to explain a method for manufacturing the prior art.
Figure 19:
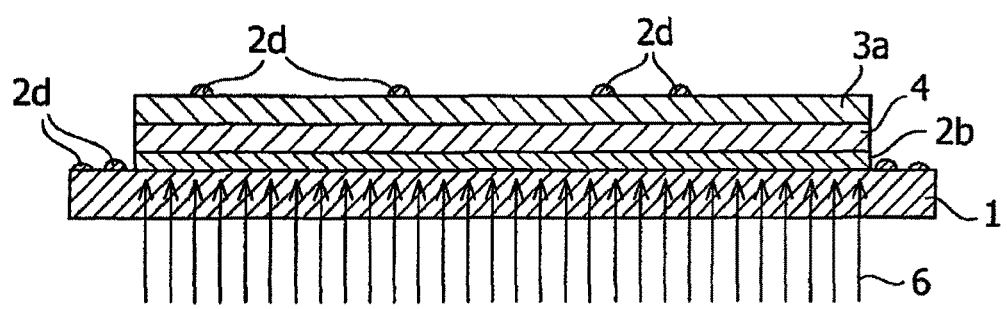
FIG. 19 is a cross-sectional view schematically showing a layered structure, to explain a method for manufacturing the prior art.
Figure 20:
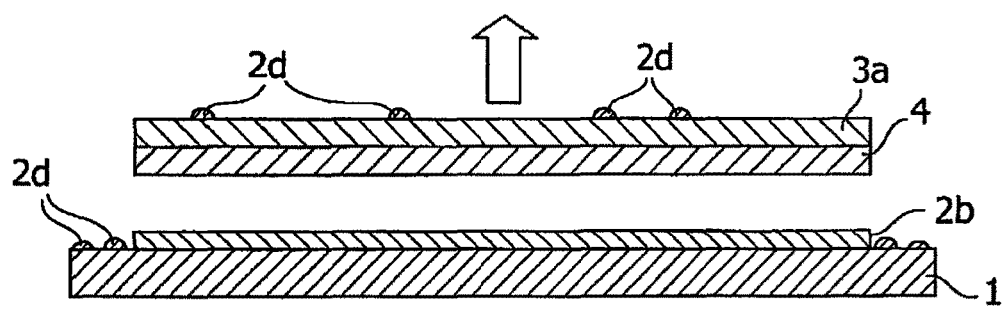
FIG. 20 is a cross-sectional view schematically showing a layered structure, to explain a method for manufacturing the prior art.
Figure 21:
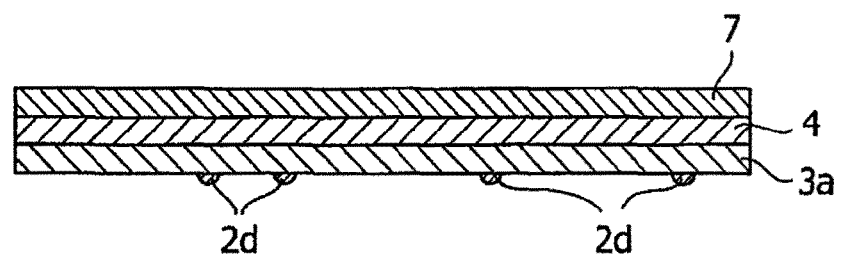
FIG. 21 is a cross-sectional view schematically showing a layered structure, to explain a method for manufacturing the prior art.
Figure 22:
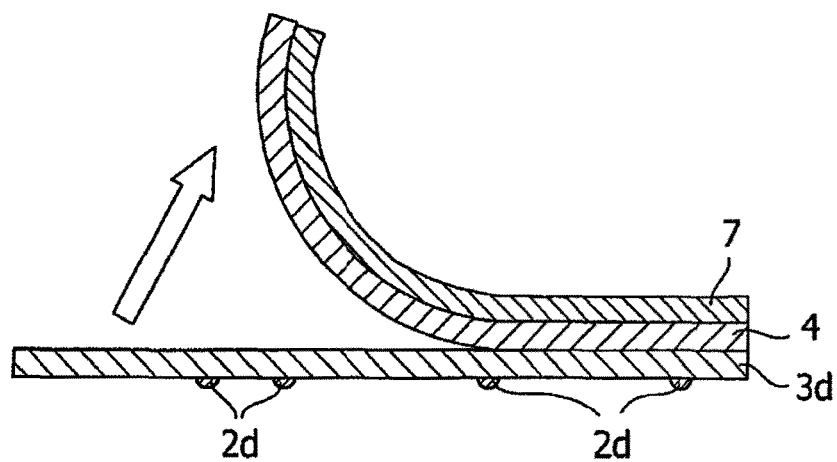
FIG. 22 is a cross-sectional view schematically showing a layered structure, to explain a method for manufacturing the prior art.

The cleaning brush 14 is not particularly limited to the form shown in FIG. 13 and FIG. 14, and for example a cleaning brush 14a may be configured so as to rotate about an axis perpendicular to the supporting substrate 1, as shown in (a) of FIG. 15, or a cleaning brush 14b may be configured to rotate about an axis parallel to the supporting substrate 1, as shown in (b) of FIG. 15.

In the above, cases were explained in which the invention is applied to treatment of a semiconductor substrate; however, the invention is not limited to such applications, and can be applied so long as treatment of a plate-shape member joined with a supporting substrate is performed. For example, application to the manufacture of a MEMS device is also possible.

The invention claimed is:

1. A method for manufacturing a semiconductor device, comprising the following steps in order:
   a step of forming an adhesive layer on one surface of a substrate for treatment;
   a step of forming a photothermal conversion layer on one surface of a supporting substrate having a surface with an outer shape larger than that of the surface of the substrate for treatment;
   a step of bonding the substrate for treatment onto the surface of the photothermal conversion layer with the adhesive layer interposed, to obtain a layered member;
   a step of removing, from the layered member, a portion of the photothermal conversion layer that protrudes from the substrate for treatment, and cleaning a portion of the supporting substrate exposed by removal of the photothermal conversion layer;
   a step of performing, for the layered member after the removal and cleaning, treatment on the surface of the substrate for treatment on the side opposite the surface bonded with the supporting substrate wherein the treatment is performed by grinding, etching, or a combination of grinding and etching, a wet treatment, sputtering, ion implantation, heat treatment, CVD, or patterning; and a step of separating the substrate for treatment after the treatment, from the adhesive layer, by irradiating the photothermal conversion layer with light to perform thermal decomposition of the photothermal conversion layer.

2. A method for manufacturing a semiconductor device, comprising the following steps in order:

a step of forming an adhesive layer on one surface of a substrate for treatment;

a step of forming a photothermal conversion layer on one surface of a supporting substrate having a surface with an outer shape larger than that of the surface of the substrate for treatment;

a step of bonding the substrate for treatment onto the surface of the photothermal conversion layer with the adhesive layer interposed, to obtain a layered member;

a step of performing, for the layered member, treatment on the surface of the substrate for treatment on the side opposite the surface bonded with the supporting substrate, wherein the surface of the substrate for treatment is treated by grinding, etching or a combination of grinding and etching;

a step of removing, from the layered member, a portion of the photothermal conversion layer that protrudes from the substrate for treatment, and cleaning a portion of the supporting substrate exposed by removal of the photothermal conversion layer, during the step of performing treatment on the surface of the substrate for treatment on the side opposite the bonded surface, wherein the photothermal conversion layer is removed by directing alkaline aqueous solution toward a peripheral edge of said supporting substrate; and a step of separating the substrate for treatment from the adhesive layer after treatment of the surface on the side opposite the bonded surface is completed, by irradiating the photothermal conversion layer with light to perform thermal decomposition of the photothermal conversion layer.

3. The method for manufacturing a semiconductor device according to claim 1, wherein in the step of partially removing the photothermal conversion layer and performing cleaning, an alkaline aqueous solution is dropped onto the portion protruding from the substrate for treatment, and thereafter cleaning is performed using a cleaning liquid flow.

4. The method for manufacturing a semiconductor device according to claim 1, wherein in the step of partially removing the photothermal conversion layer and performing cleaning, an alkaline aqueous solution is dropped onto the portion protruding from the substrate for treatment, and thereafter cleaning is performed using a brush.

5. The method for manufacturing a semiconductor device according to claim 3, wherein the alkaline aqueous solution is sodium hydroxide aqueous solution, potassium hydroxide aqueous solution, aqueous ammonia, tetra-methyl ammonium hydroxide (TMAH) aqueous solution, or aqueous ammonia-hydrogen peroxide solution, or a liquid mixture of these.

6. The method for manufacturing a semiconductor device according to claim 2, wherein in the step of partially removing the photothermal conversion layer and performing cleaning, an alkaline aqueous solution is dropped onto the portion protruding from the substrate for treatment, and thereafter cleaning is performed using a brush.

7. The method for manufacturing a semiconductor device according to claim 2, wherein the alkaline aqueous solution is sodium hydroxide aqueous solution, potassium hydroxide aqueous solution, aqueous ammonia, tetra-methyl ammonium hydroxide (TMAH) aqueous solution, or aqueous ammonia-hydrogen peroxide solution, or a liquid mixture of these.

8. The method for manufacturing a semiconductor device according to claim 6, wherein the alkaline aqueous solution is sodium hydroxide aqueous solution, potassium hydroxide aqueous solution, aqueous ammonia, tetra-methyl ammonium hydroxide (TMAH) aqueous solution, or aqueous ammonia-hydrogen peroxide solution, or a liquid mixture of these.

9. The method for manufacturing a semiconductor device according to claim 4, wherein the alkaline aqueous solution is sodium hydroxide aqueous solution, potassium hydroxide aqueous solution, aqueous ammonia, tetra-methyl ammonium hydroxide (TMAH) aqueous solution, or aqueous ammonia-hydrogen peroxide solution, or a liquid mixture of these.

10. The method according to claim 2, wherein the alkaline aqueous solution is water.

11. The method according to claim 2, wherein the substrate for treatment is treated by grinding.

12. The method according to claim 2, wherein the layered member is rotated during the removing step.

13. The method according to claim 1, wherein the layered member is rotated during the removing step.

* * * * *